(12) United States Patent
Campbell et al.

(10) Patent No.: US 6,461,436 B1
(45) Date of Patent: Oct. 8, 2002

(54) APPARATUS AND PROCESS OF IMPROVING ATOMIC LAYER DEPOSITION CHAMBER PERFORMANCE

(75) Inventors: Philip H. Campbell, Meridian; David J. Kubista, Nampa, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/977,612

(22) Filed: Oct. 15, 2001

(51) Int. Cl.[7] .............................................. C23C 16/00
(52) U.S. Cl. ...................... 118/715; 118/724; 118/728
(58) Field of Search ................. 118/715, 724, 118/728; 438/507, 509, 680

(56) References Cited

U.S. PATENT DOCUMENTS

| | | | |
|---|---|---|---|
| 5,879,459 A | * | 3/1999 | Gadgil et al. ............... 118/715 |
| 6,042,652 A | * | 3/2000 | Hyun et al. ................. 118/719 |
| 6,143,659 A | | 11/2000 | Leem |
| 6,174,377 B1 | | 1/2001 | Doering et al. |
| 6,174,809 B1 | | 1/2001 | Kang et al. |
| 6,270,572 B1 | | 8/2001 | Kim et al. |
| 6,305,314 B1 | * | 10/2001 | Sneh et al. .............. 118/723 R |
| 6,380,081 B1 | * | 4/2002 | Lee .............................. 438/681 |
| 6,387,185 B2 | * | 5/2002 | Doering et al. ............. 118/729 |

OTHER PUBLICATIONS

Ott et al., $Al_3 O_3$ thin film growth on Si(100) using binary reaction sequence chemistry, Thin Solid Films, 292, 1997, pp. 135–144.

Singer, P., Atomic Layer Deposition Targets Thin Films, Semiconductor International, Sep. 1999, pp. 1–3.

* cited by examiner

*Primary Examiner*—Alexander Ghyka
(74) *Attorney, Agent, or Firm*—Killworth, Gottman, Hagan & Schaeff, L.L.P.

(57) ABSTRACT

An apparatus and process for atomic layer deposition that minimizes mixing of the chemicals and reactive gases is disclosed. The first precursor and second precursor are only mixed with other chemicals and reactive gases when and where desired by installing and monitoring a dispensing fore-line. Also, independent and dedicated chamber outlets, isolation valves, exhaust fore-lines, and exhaust pumps are provided that are activated for the specific gas when needed.

33 Claims, 3 Drawing Sheets

APPARATUS AND PROCESS OF IMPROVING ATOMIC LAYER DEPOSITION CHAMBER PERFORMANCE

BACKGROUND OF THE INVENTION

The present invention relates to atomic layer deposition. More specifically, the present invention relates to an apparatus and process for improving the performance of an atomic layer deposition chamber.

A method of depositing very thin films is atomic layer deposition (ALD). This method has several advantages over tradition chemical vapor deposition. It can be performed at lower temperatures, uses a wide range of precursors, produces very thin films, inherently obtains 100% step coverage, and can be used to "microengineer" complex film matrices.

In ALD, individual precursors are pulsed onto the surface of a wafer in a sequential manner, without mixing the precursors in the gas phase. Each individual precursor reacts with the surface to form an atomic layer in a way that only one layer can form at a time. The surface reaction occurs such that the reaction is complete, and permits no more than one layer at a time to be deposited. This occurs no matter how many molecules are applied to the surface in an overdosing mode. The films are built up by introducing short bursts of gases in rapid cycles.

According to recognitions of the present inventors, two problems occur with the ALD method. One problem concerns the diversion of the flow of liquid precursors introduced in a vapor phase. During ALD processing using a liquid delivery system, it is necessary to keep an established flow of the liquid precursor in a vapor phase. In order to keep the flow active, the flow must be diverted to a fore-line of the ALD chamber when the liquid precursor is not needed in the deposition process. When the opposing gas is pulsed, the unreacted chemical is mixed in the fore-line with the diverted chemical and reacts causing a build up in the fore-line. The build up can be severe and clogs the fore-line. A second problem concerns the reaction of the gases. Process gases are introduced individually for the ALD process and disposed of through the same fore-lines causing the gases or vapors to react with one another.

Accordingly, there is a need for an ALD apparatus and process that minimizes clogging of the fore-line of the diverted liquid precursor. There is also a need in the art to control any area that is common to the reactive gases or vapors in a way to minimize any unwanted reaction.

BRIEF SUMMARY OF THE INVENTION

These needs are met by the present invention wherein an improved ALD apparatus and process are provided. The present invention fulfills the first need of minimizing clogging of the fore-line by providing an ALD apparatus and process that allows separate chemicals to only mix when and where desired by installing and monitoring a second fore-line. The present invention fulfills the second need of minimizing the reaction of the gases in the pump lines, by allowing the reactive gases or vapors to be removed from the process reactor chamber without coming in contact with one another in an area that would create an unwanted reaction of the process gases or vapors. This is accomplished by providing independent and dedicated pumping lines and corresponding isolation valves that are activated for the specific gas when needed. The separate pump lines allow the gas to be exhausted in a manner that minimizes possible unwanted reaction of the reactive gases. Accordingly, it is an object of the present invention to provide an improved ALD apparatus and process using dispensing fore-lines and a second exhaust path in order to prevent clogging of the exhaust fore-line.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
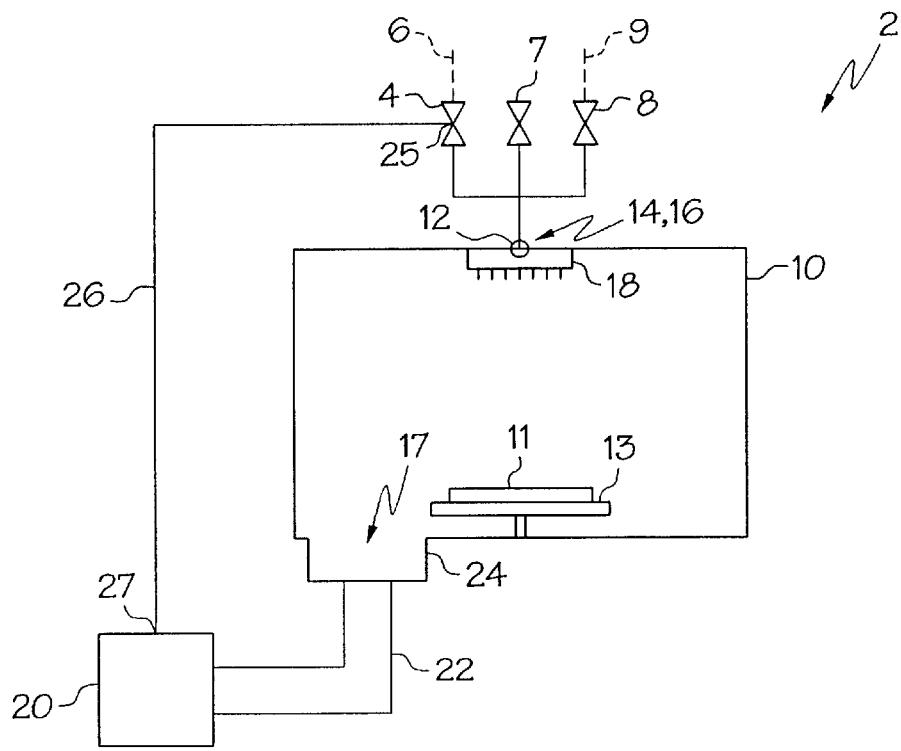
FIG. 1 presents an illustration of an ALD apparatus according to one embodiment of the present invention.

Referring initially to FIG. 1, an ALD apparatus 2 according to one embodiment of the present invention is illustrated. FIG. 1 illustrates an ALD apparatus 2 comprising a process reactor chamber 10, a first dispensing valve 4, a second dispensing value 8, an isolation valve 24, an exhaust fore-line 22, an exhaust pump 20, and a dispensing fore-line 26. The process reactor chamber 10 includes a first precursor inlet 14, a second precursor inlet 16, and a first chamber outlet 17. The first dispensing valve 4 is coupled to the first precursor inlet 14 of the process reactor chamber 10. The second dispensing valve 8 is coupled to the second precursor inlet 16 of said process reactor chamber 10. The isolation valve 24 is directly coupled to the first chamber outlet 17 of the process reactor chamber 10. The exhaust pump 20 is coupled to the isolation valve 24 by the exhaust fore-line 22, defining an exhaust path. The dispensing fore-line 26 comprises a first end 25 and a second end 27. The first end 25 is coupled to the first dispensing valve 4 and the second end 27 is coupled to the exhaust pump 20.

The first dispensing valve 4 allows a first precursor 6 to flow into the process reactor chamber 10 through a first precursor inlet 14. A continuous flow of the first precursor 6 must be maintained. Therefore, the first dispensing valve 4 selectively diverts the direction of the first precursor 6 to the first precursor inlet 14 of the process reactor chamber 10. When the first precursor 6 is not diverted into the process reactor chamber 10, it is sent to the exhaust pump 20 via a dispensing fore-line 26. The dispensing fore-line 26 is used to discard the first precursor 6 when it is not diverted into the first precursor inlet 14. The dispensing fore-line 26 may be used to isolate the first precursor 6 from other chemicals, precursors, and exhausts that would otherwise mix with the first precursor 6 and potentially cause clogging of the first exhaust fore-line 22. Thus, the exhaust fore-line 22 remains clean and flow remains stable and consistent.

The process reactor chamber 10 comprises a first precursor inlet 14, a second precursor inlet 16, a heater 13, a wafer 11, and a shower head device 18. The first precursor inlet 14 and second precursor inlet 16 can share a common opening 12 or alternatively have separate openings. The first precursor inlet 14 may direct the first precursor 6 through a shower head device 18 that distributes the first precursor 6 into the process reactor chamber 10. Once in the process reactor chamber 10 the first precursor 6 is absorbed onto the surface of a wafer 11. The wafer rests on a heater 13. The manner in which absorption of the precursor is achieved is beyond the scope of the present invention and is well known in the art. It may be gleaned from any one of a number of teachings relating to atomic layer deposition.

After the first precursor 6 is absorbed onto the wafer 11, unreacted first precursor is purged out of the process reactor chamber 10 by introducing a purge gas via the purge valve 7 into the chamber outlet 17. Unreacted first precursor flows directly into the isolation valve 24 where unreacted first precursor is transferred to the exhaust pump 20 via the exhaust fore-line 22.

The first precursor 6 and second precursor 9 are introduced in separate intervals. Once unreacted first precursor is purged from the process reactor chamber 10 through use of the purging valve 7, the second dispensing valve 8 allows for the introduction of the second precursor 9 into the second precursor inlet 16 and ultimately into the process reactor chamber 10. The second precursor inlet 16 directs the second precursor 9 through a shower head device 18 that distributes the second precursor 9 into the process reactor chamber 10. The second precursor 9 then reacts with the layer formed on the wafer 11 from the first precursor 6, creating a monolayer of film on the wafer 11.

Unreacted second precursor is purged from the process reactor chamber 10, using the purging valve 7, into the chamber outlet 17. Unreacted second precursor flows directly into the isolation valve 24 where unreacted second precursor is transferred to the exhaust pump 20 via the exhaust fore-line 22.

This process of the introduction, reaction, and purging alternating the first precursor 6 with the second precursor 9 is performed at a high rate of speed with continuous successions.

For the purposes of describing and defining the present invention, it is noted that the precise mechanism by which the molecules of the first precursor adhere to the surface of the semiconductor substrate is not the subject of the present invention. The mechanism is merely described herein as 'absorption' The generic term 'absorption' is intended to cover absorption, adsorption, and any other similar mechanisms by which the precursor may form a monolayer upon the surface of the wafer 11.

Figure 2:
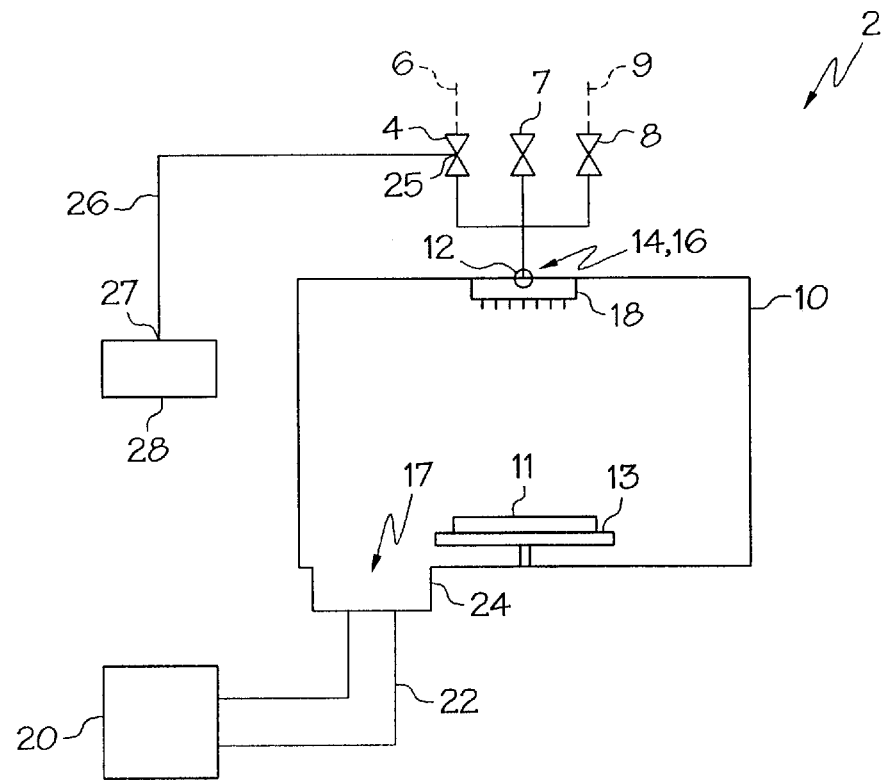
FIG. 2 presents an illustration of an ALD apparatus according to another embodiment of the present invention.

The embodiment of the present invention illustrated in FIG. 2 differs from FIG. 1 in that it utilizes a dispensing pump 28. In this embodiment, the first end 25 of the dispensing fore-line 26 is coupled to the dispensing valve 4. The second end 27 of the dispensing fore-line 26 is coupled to the dispensing pump 28. The dispensing pump 28 collects the undiverted first precursor 6 so that the undiverted first precursor 6 is isolated from other chemicals, precursors, and exhausts that would otherwise mix with the first precursor 6 and potentially cause clogging of the first exhaust fore-line 22. Thus, the exhaust fore-line 22 remains clean and flow remains stable and consistent.

Figure 3:
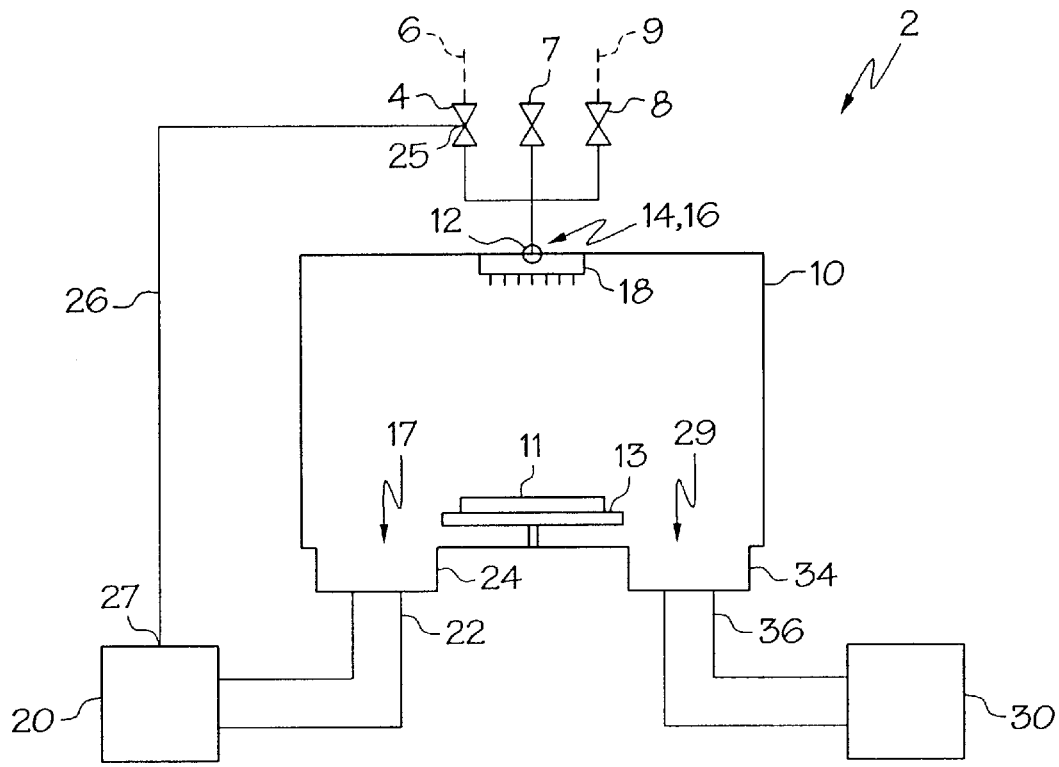
FIG. 3 presents an illustration of an ALD apparatus according to still another embodiment of the present invention.

The embodiment of FIG. 3 differs from that illustrated in FIG. 2 because the second isolation valve 34, the second exhaust fore-line 36, and the second exhaust pump 30 are shown, thus defining a second exhaust path. This second exhaust path is constructed to keep the unreacted first precursor and the unreacted second precursor separate. Thereby, reducing the possibility of mixing and clogging the either of the exhaust fore-lines 22,36. The second isolation valve 34, the second exhaust fore-line 36, and the second exhaust pump 30 operate in a similar manner as the first isolation valve 24, the first exhaust fore-line 22, and the first exhaust pump 20. After the second precursor 9 is absorbed onto the wafer 11, the unreacted second precursor is purged out of the process reactor chamber 10 by introducing a purge gas via the purge valve 7 into the second chamber outlet 29. The unreacted second precursor flows directly into the second isolation valve 34 where the unreacted second precursor is transferred to the second exhaust pump 30 via the second exhaust fore-line 36.

The embodiment in FIG. 3 also differs from that illustrated in FIG. 2 because the dispensing fore-line 26 is connected to the first exhaust path. Specifically, the dispensing fore-line 26 is connected to the first exhaust pump 20. The dispensing valve could alternatively be coupled to the first exhaust fore-line 22 or directly to a dispensing pump 28 as illustrated in FIG. 2.

Figure 4:
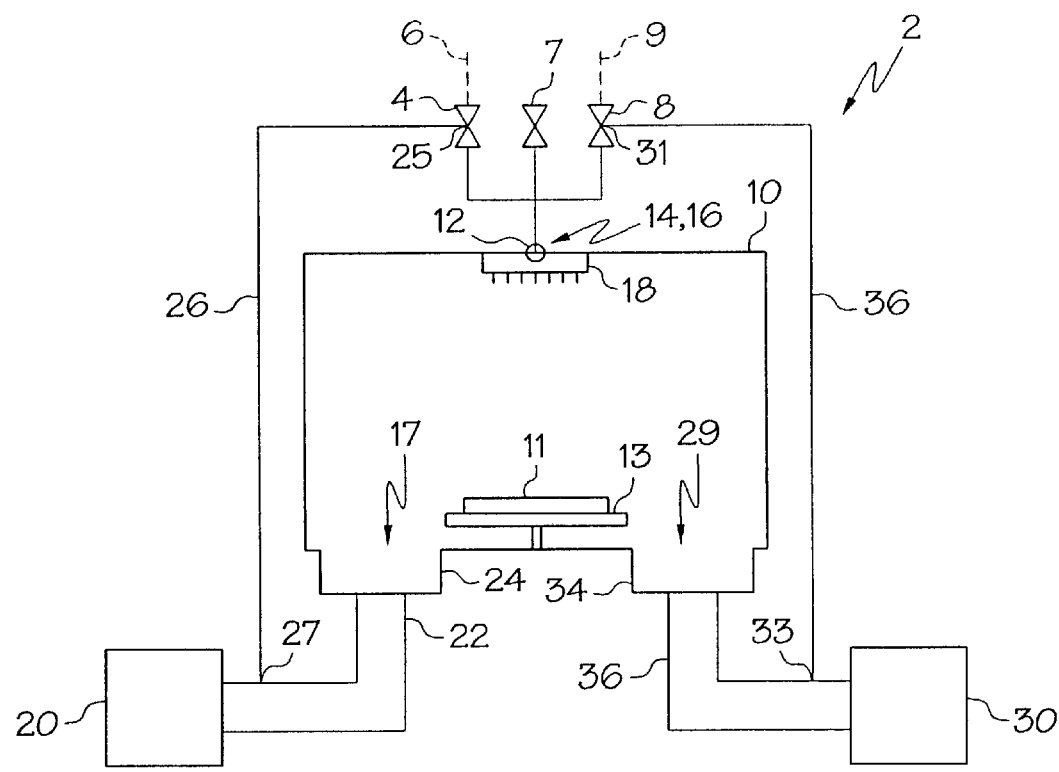
FIG. 4 presents an illustration of an ALD apparatus according to yet another embodiment of the present invention.

The embodiment of FIG. 4 differs from that of FIG. 3 because a second dispensing fore-line 36 is extended from the second dispensing valve 8 to the second exhaust path, specifically the second exhaust fore-line 33. The second dispensing fore-line 36 can alternatively be directly connected to the second exhaust pump 30, similar to the embodiment of FIG. 1 or connected to a second dispensing pump, similar to the embodiment of FIG. 2. The second dispensing pump would operate in a similar manner as the first dispensing pump 28 described above. The second dispensing pump collects the undiverted second precursor 9 so that the undiverted second precursor 9 is isolated from other chemicals, precursors, and exhausts that would otherwise mix with the second precursor 9 and potentially cause clogging of the second exhaust fore-line 36. Thus, the second exhaust fore-line 36 remains clean and flow remains stable and consistent.

The second dispensing fore-line 36 operates in a similar manner as the first dispensing fore-line 26. The second dispensing fore-line 36 is used to discard the second precursor 9 when it is not diverted into the second precursor inlet 16. The second dispensing fore-line 36 maybe used to isolate the second precursor 9 from other chemicals, precursors, and exhausts that would otherwise mix with the second precursor 9 and potentially cause clogging of the second exhaust fore-line 33. Thus, the second exhaust fore-line 33 remains clean and flow remains stable and consistent.

Figure 5:
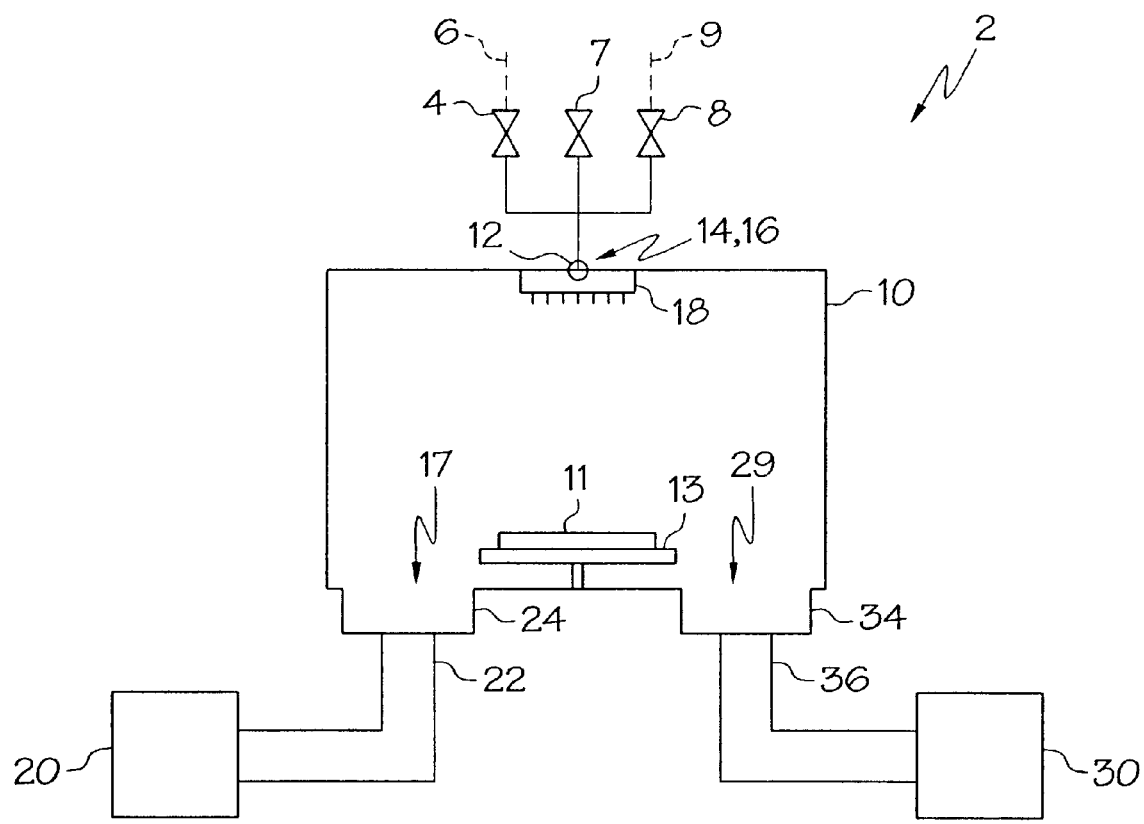
FIG. 5 presents an illustration of an ALD apparatus according to yet another embodiment of the present invention.

FIG. 5 differs from the previous figures because it does not show the first dispensing fore-line 26 or the second dispensing fore-line 36. Therefore, only the two separate exhaust paths are depicted.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. An atomic layer deposition apparatus comprising:
   a process reactor chamber including a first precursor inlet, a second precursor inlet, and a chamber outlet;

a first dispensing valve coupled to said first precursor inlet of said process reactor chamber;

a second dispensing valve coupled to said second precursor inlet of said process reactor chamber;

an isolation valve directly coupled to said chamber outlet of said process reactor chamber;

an exhaust fore-line;

an exhaust pump coupled to said isolation valve by said exhaust fore-line wherein said isolation valve, said exhaust fore-line, and said exhaust pump are arranged to define an exhaust path isolated from said reactor chamber when said isolation valve is in a closed state; and a dispensing fore-line comprising a first end and a second end, wherein said fist end is coupled to said first dispensing valve and said second end is coupled to said exhaust path.

2. An apparatus as claimed in claim 1 wherein said first precursor inlet and said second precursor inlet share a common opening.

3. An apparatus as claimed in claim 1 wherein said first precursor inlet and said second precursor inlet have separate openings.

4. An apparatus as claimed in claim 1 wherein said apparatus comprises a purging valve.

5. An apparatus as claimed in claim 1 wherein said process reactor chamber further includes a shower head device.

6. An atomic layer deposition apparatus comprising:

a process reactor chamber including a first precursor inlet, a second precursor inlet, and a chamber outlet;

a vapor supply coupled to said first precursor inlet;

a first dispensing valve coupled to said first precursor inlet of said process reactor chamber;

a second dispensing valve coupled to said second precursor inlet of said process reactor chamber;

an isolation valve directly coupled to said chamber outlet of said process reactor chamber;

an exhaust fore-line;

an exhaust pump coupled to said isolation valve by said exhaust fore-line wherein said isolation valve, said exhaust fore-line, and said exhaust pump are arranged to define an exhaust path isolated from said reactor chamber when said isolation valve is in a closed state; and a dispensing fore-line comprising a first end and a second end, wherein said first end is coupled to said first dispensing valve and said second end is coupled to said exhaust path.

7. An atomic layer deposition apparatus comprising:

a process reactor chamber including a first precursor inlet, a second precursor inlet, a first chamber outlet, and a second chamber outlet;

a first dispensing valve coupled to said first precursor inlet of said process reactor chamber;

a second dispensing valve coupled to said second precursor inlet of said process reactor chamber;

a first isolation valve directly coupled to said first chamber outlet of said process reactor chamber;

an exhaust fore-line;

an exhaust pump coupled to said first isolation valve by said exhaust fore-line wherein said isolation valve, said exhaust fore-line, and said exhaust pump are arranged to define an exhaust path isolated from said process reactor chamber when said isolation valve is in a closed state;

a dispensing fore-line comprising a first end and a second end; and a dispensing pump coupled to said first dispensing valve by said dispensing fore-line, wherein said first end of said dispensing fore-line is coupled to said first dispensing valve and said second end of said dispensing fore-line is coupled to said dispensing pump.

8. An atomic layer deposition apparatus comprising:

a process reactor chamber including a first precursor inlet, a second precursor inlet, a first chamber outlet, and a second chamber outlet;

a first dispensing valve coupled to said first precursor inlet of said process reactor chamber;

a vapor supply coupled to said first precursor inlet;

a second dispensing valve coupled to said second precursor inlet of said process reactor chamber;

a first isolation valve directly coupled to said first chamber outlet of said process reactor chamber;

a first exhaust fore-line;

a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;

a dispensing fore-line comprising a first end and a second end; and a dispensing pump coupled to said first dispensing valve by said dispensing fore-line, wherein said first end of said dispensing fore-line is coupled to said first dispensing valve and said second end of said dispensing fore-line is coupled to said dispensing pump.

9. An atomic layer deposition apparatus comprising:

a process reactor chamber including a first precursor inlet, a second precursor inlet, a first chamber outlet, and a second chamber outlet;

a first dispensing valve coupled to said first precursor inlet of said process reactor chamber;

a second dispensing valve coupled to said second precursor inlet of said process reactor chamber;

a first isolation valve directly coupled to said first chamber outlet of said process reactor chamber;

a first exhaust fore-line;

a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;

a dispensing fore-line comprising a first end and a second end, wherein said first end is coupled to said dispensing valve and said second end is coupled to said first exhaust path;

a second isolation valve directly coupled to said second chamber outlet of said process reactor chamber;

a second exhaust fore-line; and a second exhaust pump coupled to said second isolation valve by said second exhaust fore-line wherein said second isolation valve, said second exhaust fore-line, and said second exhaust pump are arranged to define a second exhaust path isolated from said process reactor chamber when said second isolation valve is in a closed state.

10. An apparatus as claimed in claim 9 wherein said second end of said dispensing fore-line is coupled to said first exhaust fore-line.

11. An apparatus as claimed in claim 9 wherein said second end of said dispensing fore-line is coupled to said first exhaust pump.

12. An atomic layer deposition apparatus comprising:
a process reactor chamber including a first precursor inlet, a second precursor inlet, a first chamber outlet, and a second chamber outlet;
a first dispensing valve coupled to said first precursor inlet of said process reactor chamber,
a vapor supply coupled to said first precursor inlet;
a second dispensing valve coupled to said second precursor inlet of said process reactor chamber;
a first isolation valve directly coupled to said first chamber outlet of said process reactor chamber;
a first exhaust fore-line;
a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;
a dispensing fore-line comprising a first end and a second end, wherein said first end is coupled to said dispensing valve and said second end is coupled to said first exhaust path;
a second isolation valve directly coupled to said second chamber outlet of said process reactor chamber;
a second exhaust fore-line; and
a second exhaust pump coupled to said second isolation valve by said second exhaust fore-line wherein said second isolation valve, said second exhaust fore-line, and said second exhaust pump are arranged to define a second exhaust path isolated from said process reactor chamber when said second isolation valve is in a closed state.

13. An apparatus as claimed in claim 12 wherein said second end of said dispensing fore-line is coupled to said first exhaust fore-line.

14. An apparatus as claimed in claim 12 wherein said second end of said dispensing fore-line is coupled to said first exhaust pump.

15. An atomic layer deposition apparatus comprising:
a process reactor chamber including a first precursor inlet, a second precursor inlet, a first chamber outlet, and a second chamber outlet;
a first dispensing valve coupled to said first precursor inlet of said process reactor chamber;
a second dispensing valve coupled to said second precursor inlet of said process reactor chamber;
a first isolation valve directly coupled to said first chamber outlet of said process reactor chamber;
a first exhaust fore-line;
a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;
a dispensing fore-line comprising a first end and a second end;
a dispensing pump coupled to said first dispensing valve by said dispensing fore-line, wherein said first end of said dispensing fore-line is coupled to said first dispensing valve and said second end of said dispensing fore-line is coupled to said dispensing pump;
a second isolation valve directly coupled to said second chamber outlet of said process reactor chamber;
a second exhaust fore-line; and
a second exhaust pump coupled to said second isolation valve by said second exhaust fore-line wherein said second isolation valve, said second exhaust fore-line, and said second exhaust pump are arranged to define a second exhaust path isolated from said process reactor chamber when said second isolation valve is in a closed state.

16. An atomic layer deposition apparatus comprising:
a process reactor chamber including a first precursor inlet, a second precursor inlet, a first chamber outlet, and a second chamber outlet;
a first dispensing valve coupled to said first precursor inlet of said process reactor chamber;
a vapor supply coupled to said first precursor inlet;
a second dispensing valve coupled to said second precursor inlet of said process reactor chamber;
a first isolation valve directly coupled to said first chamber outlet of said process reactor chamber;
a first exhaust fore-line;
a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;
a dispensing fore-line comprising a first end and a second end;
a dispensing pump coupled to said first dispensing valve by said dispensing fore-line, wherein said first end of said dispensing fore-line is coupled to said first dispensing valve and said second end of said dispensing fore-line is coupled to said dispensing pump;
a second isolation valve directly coupled to said second chamber outlet of said process reactor chamber;
a second exhaust fore-line; and
a second exhaust pump coupled to said second isolation valve by said second exhaust fore-line wherein said second isolation valve, said second exhaust fore-line, and said second exhaust pump are arranged to define a second exhaust path isolated from said process reactor chamber when said second isolation valve is in a closed state.

17. An atomic layer deposition apparatus comprising:
a process reactor chamber including a first precursor inlet, a second precursor inlet, a first chamber outlet, and a second chamber outlet;
a first dispensing valve coupled to said first precursor inlet of said process reactor chamber;
a second dispensing valve coupled to said second precursor inlet of said process reactor chamber;
a first isolation valve directly coupled to said first chamber outlet of said process reactor chamber;
a first exhaust fore-line;
a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;

a first dispensing fore-line comprising a first end and a second end, wherein said first end is coupled to said first dispensing valve and said second end is coupled to said first exhaust path;

a second isolation valve directly coupled to said second chamber outlet of said process reactor chamber;

a second exhaust fore-line;

a second exhaust pump coupled to said second isolation valve by said second exhaust fore-line wherein said second isolation valve, said second exhaust fore-line, and said second exhaust pump are arranged to define a second exhaust path isolated from said process reactor chamber when said second isolation valve is in a closed state; and a second dispensing fore-line comprising a first end and a second end, wherein said first end is coupled to said second dispensing valve and said second end is coupled to said second exhaust path.

18. An apparatus as claimed in claim 17 wherein said second end of said first dispensing fore-line is coupled to said first exhaust fore-line.

19. An apparatus as claimed in claim 17 wherein said second end of said first dispensing fore-line is coupled to said first exhaust pump.

20. An apparatus as claimed in claim 17 wherein said second end of second dispensing fore-line is coupled to said second exhaust fore-line.

21. An apparatus as claimed in claim 17 wherein said second end of second dispensing fore-line is coupled to said second exhaust pump.

22. An atomic layer deposition apparatus comprising:

a process reactor chamber including a first precursor inlet, a second precursor inlet, a first chamber outlet, and a second chamber outlet;

a first dispensing valve coupled to said first precursor inlet of said process reactor chamber;

a vapor supply coupled to said first precursor inlet;

a second dispensing valve coupled to said second precursor inlet of said process reactor chamber;

a first isolation valve directly coupled to said first chamber outlet of said process reactor chamber;

a first exhaust fore-line;

a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;

a first dispensing fore-line comprising a first end and a second end, wherein said first end is coupled to said first dispensing valve and said second end is coupled to said first exhaust path;

a second isolation valve directly coupled to said second chamber outlet of said process reactor chamber;

a second exhaust fore-line;

a second exhaust pump coupled to said second isolation valve by said second exhaust fore-line wherein said second isolation valve, said second exhaust fore-line, and said second exhaust pump are arranged to define a second exhaust path isolated from said process reactor chamber when said second isolation valve is in a closed state; and a second dispensing fore-line comprising a first end and a second end, wherein said first end is coupled to said second dispensing valve and said second end is coupled to said second exhaust path.

23. An apparatus as claimed in claim 22 wherein said second end of said first dispensing fore-line is coupled to said first exhaust fore-line.

24. An apparatus as claimed in claim 22 wherein said second end of said first dispensing fore-line is coupled to said first exhaust pump.

25. An apparatus as claimed in claim 22 wherein said second end of second dispensing fore-line is coupled to said second exhaust fore-line.

26. An apparatus as claimed in claim 22 wherein said second end of second dispensing fore-line is coupled to said second exhaust pump.

27. An atomic layer deposition apparatus comprising:

a process reactor chamber including a first precursor inlet, a second precursor inlet, a first chamber outlet, and a second chamber outlet;

a first dispensing valve coupled to said first precursor inlet of said process reactor chamber;

a second dispensing valve coupled to said second precursor inlet of said process reactor chamber;

a first isolation valve directly coupled to said first chamber outlet of said process reactor chamber;

a first exhaust fore-line;

a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;

a first dispensing fore-line comprising a first end and a second end;

a first dispensing pump coupled to said first dispensing valve by said dispensing fore-line, wherein said first end of said first dispensing fore-line is coupled to said first dispensing valve and said second end of said first dispensing fore-line is coupled to said first dispensing pump;

a second isolation valve directly coupled to said second chamber outlet of said process reactor chamber;

a second exhaust fore-line;

a second exhaust pump coupled to said second isolation valve by said second exhaust fore-line wherein said second isolation valve, said second exhaust fore-line, and said second exhaust pump are arranged to define a second exhaust path isolated from said process reactor chamber when said second isolation valve is in a closed state;

a second dispensing fore-line comprising a first end and a second end; and a second dispensing pump coupled to said second dispensing valve by said second dispensing fore-line, wherein said first end of said second dispensing fore-line is coupled to said second dispensing valve and said second end of said second dispensing fore-line is coupled to said second dispensing pump.

28. An atomic layer deposition apparatus comprising:

a process reactor chamber including a first precursor inlet, a second precursor inlet, a first chamber outlet, and a second chamber outlet;

a first dispensing valve coupled to said first precursor inlet of said process reactor chamber;

a vapor supply coupled to said first precursor inlet;

a second dispensing valve coupled to said second precursor inlet of said process reactor chamber;

a first isolation valve directly coupled to said first chamber outlet of said process reactor chamber;

a first exhaust fore-line;

a first exhaust pump coupled to said first isolation valve by said first exhaust fore-line wherein said first isolation valve, said first exhaust fore-line, and said first exhaust pump are arranged to define a first exhaust path isolated from said process reactor chamber when said first isolation valve is in a closed state;

a first dispensing fore-line comprising a first end and a second end;

a first dispensing pump coupled to said first dispensing valve by said dispensing fore-line, wherein said first end of said first dispensing fore-line is coupled to said first dispensing valve and said second end of said first dispensing fore-line is coupled to said first dispensing pump;

a second isolation valve directly coupled to said second chamber outlet of said process reactor chamber;

a second exhaust fore-line;

a second exhaust pump coupled to said second isolation valve by said second exhaust fore-line wherein said second isolation valve, said second exhaust fore-line, and said second exhaust pump are arranged to define a second exhaust path isolated from said process reactor chamber when said second isolation valve is in a closed state;

a second dispensing fore-line comprising a first end and a second end; and a second dispensing pump coupled to said second dispensing valve by said second dispensing fore-line, wherein said first end of said second dispensing fore-line is coupled to said second dispensing valve and said second end of said second dispensing fore-line is coupled to said second dispensing pump.

29. An atomic layer deposition apparatus comprising:

a process reactor chamber;

an first isolation valve directly coupled to a first chamber outlet of said process reactor;

a first exhaust pump coupled to said first isolation valve by a first fore-line;

a second isolation valve directly coupled to a first chamber outlet of said process reactor; and a second exhaust pump coupled to said second isolation valve by a second exhaust fore-line.

30. An apparatus as claimed in claim 29 wherein said first precursor inlet and said second precursor inlet share a common opening.

31. An apparatus as claimed in claim 29 wherein said first precursor inlet and said second precursor inlet have separate openings.

32. An apparatus as claimed in claim 29 wherein said apparatus comprises a purging valve.

33. An apparatus as claimed in claim 29 wherein said process reactor chamber further includes a shower head device.

* * * * *

UNITED STATES PATENT AND TRADEMARK OFFICE
CERTIFICATE OF CORRECTION

PATENT NO. : 6,461,436 B1
DATED : October 8, 2002
INVENTOR(S) : Philip H. Campbell and David J. Kubista It is certified that error appears in the above-identified patent and that said Letters Patent is hereby corrected as shown below:

<u>Column 12,</u>
Line 10, "a process reactor chamber;" should be -- a process reactor chamber including a first precursor inlet and a second precursor inlet; --;
Line 14, "by a first fore-line;" should be -- by a first exhaust fore-line; --.

Signed and Sealed this

Twenty-fourth Day of December, 2002

JAMES E. ROGAN
*Director of the United States Patent and Trademark Office*